United States Patent [19]
Kansal et al.

[11] Patent Number: 5,680,591
[45] Date of Patent: Oct. 21, 1997

[54] METHOD AND APPARATUS FOR MONITORING A ROW ADDRESS STROBE SIGNAL IN A GRAPHICS CONTROLLER

[75] Inventors: Arvind K. Kansal, Cupertino; Thomas C. Yip, Los Gatos, both of Calif.

[73] Assignee: Cirrus Logic, Inc., Fremont, Calif.

[21] Appl. No.: 412,500

[22] Filed: Mar. 28, 1995

[51] Int. Cl.$^6$ .................................................. G06F 12/06
[52] U.S. Cl. .......................... 395/517; 395/501; 365/193; 365/203; 365/205; 365/233
[58] Field of Search ........................... 395/162, 164–166, 395/401, 405, 427, 428, 432, 433, 474, 478, 550, 515, 517, 501, 507, 509, 510; 365/193, 203, 205, 222, 233, 230.01, 230.03, 230.06, 230.08

[56] References Cited

U.S. PATENT DOCUMENTS

5,185,719  2/1993  Dhong et al. ................. 365/189.01
5,335,322  8/1994  Mattison ....................... 395/164
5,479,635  12/1995  Kametani ....................... 364/200

Primary Examiner—Kee M. Tung
Attorney, Agent, or Firm—Robert P. Bell

[57] ABSTRACT

A method and apparatus for integrating a row address strobe signal monitoring circuit in a graphics controller is described. The present invention includes an improved graphics controller comprising a bi-directional input/output pad and a row address strobe signal snooping circuit to monitor the row address strobe signal to detect the pre-charge status of the signal prior to a memory access by the graphics controller. The input/output pad of the present invention enables the graphics controller to simultaneously receive and drive a row address strobe signal upon being granted permission to access memory. The row address snooping method of the present invention enables the graphics controller to pre-charge the row address strobe signal while the controller is in an inactive memory access state. Pre-charging the row address signal allows the graphics controller to immediately drive a pre-charged address strobe signal to memory upon receiving permission to access memory; thereby reducing the number of clocks it takes the graphics controller to access memory.

25 Claims, 6 Drawing Sheets

METHOD AND APPARATUS FOR MONITORING A ROW ADDRESS STROBE SIGNAL IN A GRAPHICS CONTROLLER

BACKGROUND OF THE INVENTION

1. Field of the Invention

The present invention relates to the field of computer shared system memory. More specifically, the present invention relates to a graphics controller with a row address strobe (RAS) snooping circuit for minimizing the inactive time of RAS, known as RAS pre-charge time, during an access to a frame buffer aperture of shared system memory.

2. Description of Related Art

The introduction of multimedia computing has resulted in the integration of several peripheral devices such as CD-ROMs, graphics, and video cards in the same computer system. The integration of these peripheral devices has evolved such computer systems into multimedia systems which are increasingly powerful, less expensive, and need more processing power. The demand for such highly integrated systems has resulted in the development of high performance microprocessors to power such machines.

However, as microprocessors become increasingly faster, the speed of memory devices which support such processors continue to be a major limiting factor in enhancing the performance of such multimedia computer systems. Specifically, the memory speed limits the performance of application programs on high performance multimedia systems. While fast memory devices such as static random access memory (SRAM) devices are available, their use as a computer system main memory has not risen to the level of high performance microprocessors due to the relatively high cost of SRAM devices.

In many prior art systems, peripheral devices such as a graphics card may have local memory which may be solely utilized by a specific device. With a local memory, such peripheral devices may not be capable of sharing a main system memory with a processor. Thus the main system may be solely utilized by a processor to perform various tasks in a computer system. Separating memory in a multimedia computer system may also mean that a processor may not have access to any of the memory local to the peripheral device.

Separating memory in such multimedia computer systems, often results in the wasting of system resources. For example, if the graphics controller required extra memory in order to display a high resolution video mode, for which the available local display memory is insufficient, then the graphics controller may not be able to use any particular part of main system memory which may be available. This inability to access main memory may result in sub-optimal use of available system resources.

To effectively utilize system memory, computer systems have been developed with display and system memory integrated in the same device or memory subsystem. Integrating display and system memory is described in the *Intel Shared Frame Buffer Architecture Specification*, dated Feb. 3, 1995 developed by Intel Corporation of Santa Clara, Calif. and incorporated herein by reference. The *Intel Shared Frame Buffer Architecture Specification* describes a protocol for combining the display memory (also known as a frame buffer) with main system memory in the same dynamic random access memory devices (DRAMs).

Although main system memory and display memory may be combined in the same shared memory devices, such DRAMs may maintain the electrical characteristics of conventional DRAMs, which may include requiring precharging of a row address strobe signal (RAS) by either a graphics controller or a host controller prior to starting a new memory access cycle (after either controller has been granted memory access). The RAS pre-charging is achieved by conservatively delaying the start of a new display memory access by either the graphics controller or a read or write access to memory by the host controller. Such delays may minimize the useful memory bandwidth of a shared memory device thereby decreasing overall performance of the computer system.

To improve performance and reduce memory accesses to the shared memory by a graphics controller, a system which effectively integrates main system memory and display memory to reduce and minimize overhead of RAS precharge is needed.

SUMMARY OF THE INVENTION

The present invention provides a graphics controller including a snooping circuit to monitor a shared row address strobe signal (RAS) in order to reduce the graphics controller's access time to a display memory in a system having display and main system memory physically combined in the same memory subsystem. The system memory of the preferred embodiment is implemented as one or more rows of dynamic random access memory (DRAM). When the graphics controller needs to access display memory, the graphics controller makes a request to the host controller, which, in turn, grants the graphics controller's request. Upon being granted access to shared memory, the graphics controller drives shared address, data, and control signals of the display memory.

The preferred embodiment includes a hi-directional RAS input/output (I/O) pad which interfaces the graphics controller to the system memory's shared RAS signal, and accordingly may receive and drive a RAS signal from the graphics controller. The bi-directional I/O pad constantly receives an input RAS signal driven by the host controller. The I/O pad may then drive the input RAS signal to the snooping circuit, which, in turn, drives the pre-charged RAS signal to the display memory via the output of the I/O pad.

The snooping circuit of the preferred embodiment is coupled to the I/O pad to receive an input non-pre-charged RAS signal. The snooping circuit includes a detection logic circuit to detect when a RAS signal is pre-charged. Upon detecting completion of a RAS pre-charge, the RAS snooping circuit signals to a RAS generation circuit, which subsequently drives the pre-charged RAS signal to the display memory.

The RAS generation circuit generates a pre-charged RAS signal based on, among other signals, the RAS pre-charge complete signal from the RAS snooping circuit and a memory control grant signal (MGNT#) asserted in the preferred embodiment to indicate permission for the graphics controller to access the display memory.

Memory access control signals comprising a row address strobe (RAS), a memory request signal (MREQ#), and a memory grant signal (MGNT#) may be utilized for control and access to display memory in the shared DRAM devices installed in the system memory. The MREQ# and MGNT# signals are arbitration signals which couple the graphics controller to the memory bus of the computer system. When the graphics controller requires control of the memory bus, it asserts the device specific MREQ# signal to the host controller. When the host controller has determined that the graphic controller should be granted control of the memory bus, the host controller asserts the MGNT# signal specific to the graphic controller to enable the graphic controller control the memory bus to access the frame buffer in the system memory.

Advantages of the preferred embodiment of the present invention include the effective integration of a RAS snooping circuit in the graphics controller to reduce access time by the graphics controller to the display memory by pre-charging an access control signal to the system memory when the graphic controller is in an inactive memory access state. The preferred embodiment thus has the advantage of automatically receiving a non-pre-charged RAS signal and subsequently generating a pre-charged RAS signal to begin an early access to display memory, thereby minimizing memory latency experienced by the processor as a result of display memory access by the graphics controller. Minimizing the RAS pre-charge time, also results in maximizing useful memory bandwidth of the shared memory subsystem since the savings of pre-charge time accrue over each new memory access cycle of the graphics controller.

The bi-directional I/O pad of the preferred embodiment has the advantage of enabling the graphics controller to sample the non-pre-charged RAS signal at the input portion of the pad and use this signal to determine the earliest clock cycle in which the graphics controller can then drive the pre-charged RAS signal out of the output portion of the pad, thereby minimizing the waiting time required for RAS pre-charge.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purpose, and therefore resort to the claims is necessary to determine the inventive subject matter.

DETAILED DESCRIPTION OF THE PREFERRED EMBODIMENT

FIGS. 1 through 6 of the drawings disclose various embodiments of the present invention for purposes of illustration only. One skilled in the art will readily recognize from the following discussion that alternative embodiments of the structures and methods illustrated herein may be employed without departing from the principles of the invention.

Figure 1:
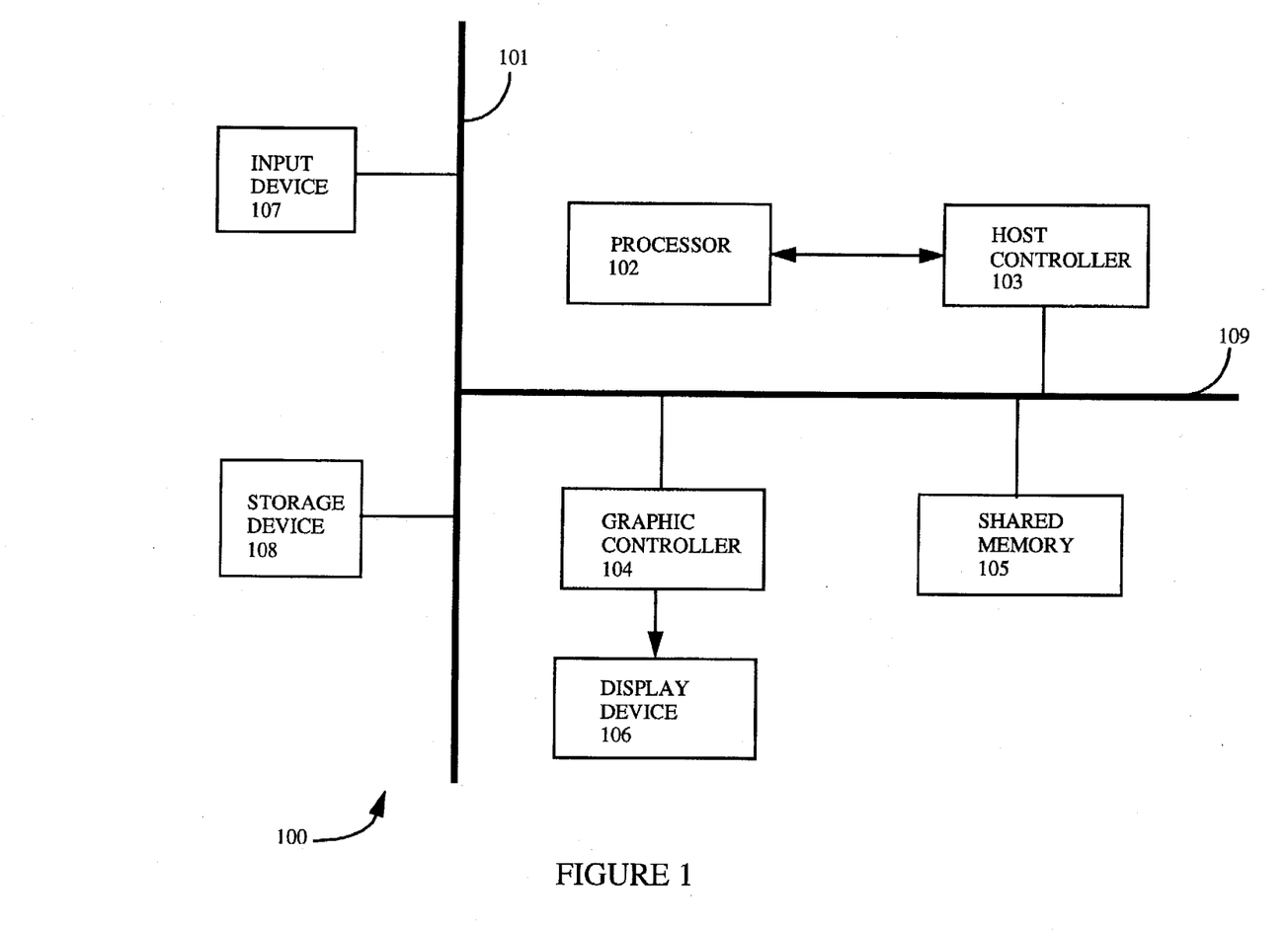
FIG. 1 is a block diagram illustration of a computer system architecture of the present invention.

Reference is first made to FIG. 1 which is a block diagram illustrating a computer system of the present invention. As illustrated in FIG. 1, computer system 100 of the present invention generally comprises system bus 101 for communicating information, processor 102 coupled to host controller 103 for processing instructions, as well as generating control signals to access system memory. Host controller 103 is coupled to system memory bus 109 for controlling access to memory by processor 102. Shared main memory 105 is also coupled to system memory bus 109 for storing data and instructions for processor 102 and graphics controller 104 in computer system 100. Graphics controller 104 is also shown coupled to system memory bus 109 for controlling access to main memory 105 by display device 106.

Computer system 100 also includes display device 106 coupled to graphics controller 104 for displaying information to a computer user. Alphanumeric input device 107 may be coupled to system bus 101 for communicating information and command selections to processor 102. Storage device 108 may also be coupled to system bus 101 for storing data for computer system 100.

Figure 2:
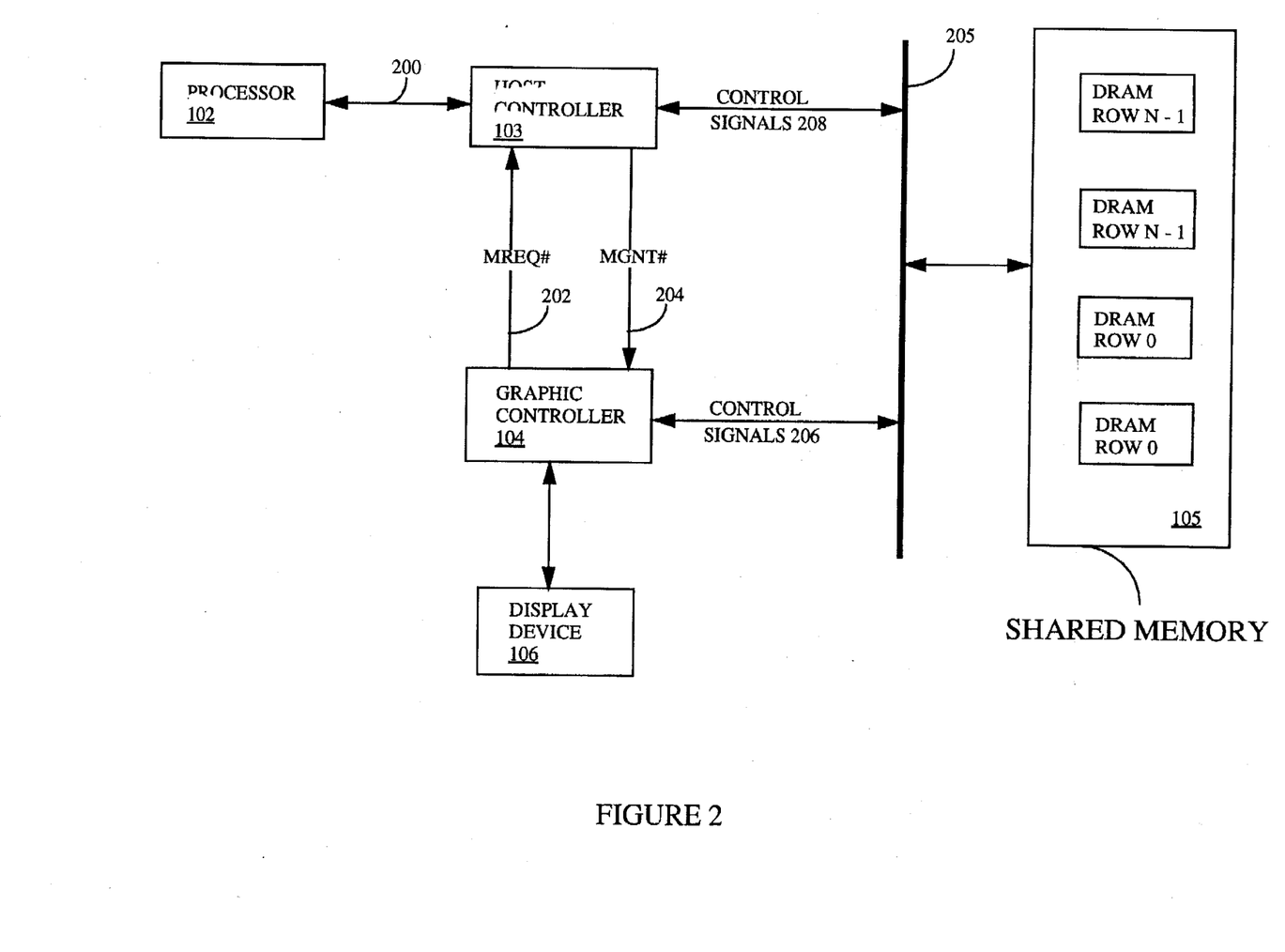
FIG. 2 is a block diagram illustrating interconnection of the preferred embodiment with a processor, core logic device, and shared memory device including a frame buffer.

Reference is now made to FIG. 2, which is a block diagram illustrating an access to shared memory 105 by one embodiment of the preferred embodiment of the present invention. As illustrated in FIG. 2, processor 102 may be coupled to host controller 103 via address and data line 200 to send address and data requests to main memory 105. Processor 102 initiates access requests to memory subsystem 105 by asserting an address line to host controller 103.

Host controller 103 is coupled to shared memory subsystem 105 via a memory bus 205. Shared memory subsystem 105 may comprise rows of system dynamic random access (DRAM) memory for the computer system and a frame buffer (display memory DRAM) for display device 106 of the computer system. Display device 106 obtains video data from graphics controller 104 to generate a video display.

Graphics controller 104 is coupled to the shared memory subsystem 105 via memory bus 205 and host controller 103 via memory request line (MREQ#) 202 and memory grant line (MGNT#) 204. Graphics controller 104 requests access to a display memory portion of system memory subsystem 105 to draw graphics images to and refresh display device 106.

In a normal mode of operation, host controller 103 applies an address, data, and control signals 208 to write/read data to/from shared system memory 105 at the behest of processor 102. Host controller 103 retains control of memory bus 205 until graphics controller 104 requests control of memory bus 205.

Graphics controller 104 requests control of memory bus 205 by asserting memory request signal (MREQ#) 202 to host controller 103. In response to an access request by graphics controller 104, host controller 103 asserts memory grant signal (MGNT#) 204 signaling transfer of control of memory bus signals to graphics controller 104. After retaining control of bus 205, graphics controller 104 asserts memory control signals 206 to access the frame buffer portion in shared main memory 105.

In the preferred embodiment, the key memory control signal, the RAS# signal, is asserted soon after MGNT# signal 204 is asserted. The ability to assert the RAS signal immediately after asserting MGNT# 204, is achieved by snooping circuit 310 which snoops the shared RAS line in graphics controller 104 during accesses to main memory 105 by host controller 103. The RAS snooping circuit 310 of the preferred embodiment enables the graphics controller 104 to start a memory access cycle as soon as the RAS pre-charge is complete and MGNT# signal 204 is sampled active.

Snooping the shared RAS line saves any extra memory clock cycles which may have been wasted in RAS pre-charging after a memory access request is granted to graphics controller 104 as is the case in the prior art where the RAS is not snooped. Graphics controller 104 may relinquish control of the memory bus 205 when its memory access cycle is complete and when host controller 103 deasserts MGNT# signal 204.

Figure 3:
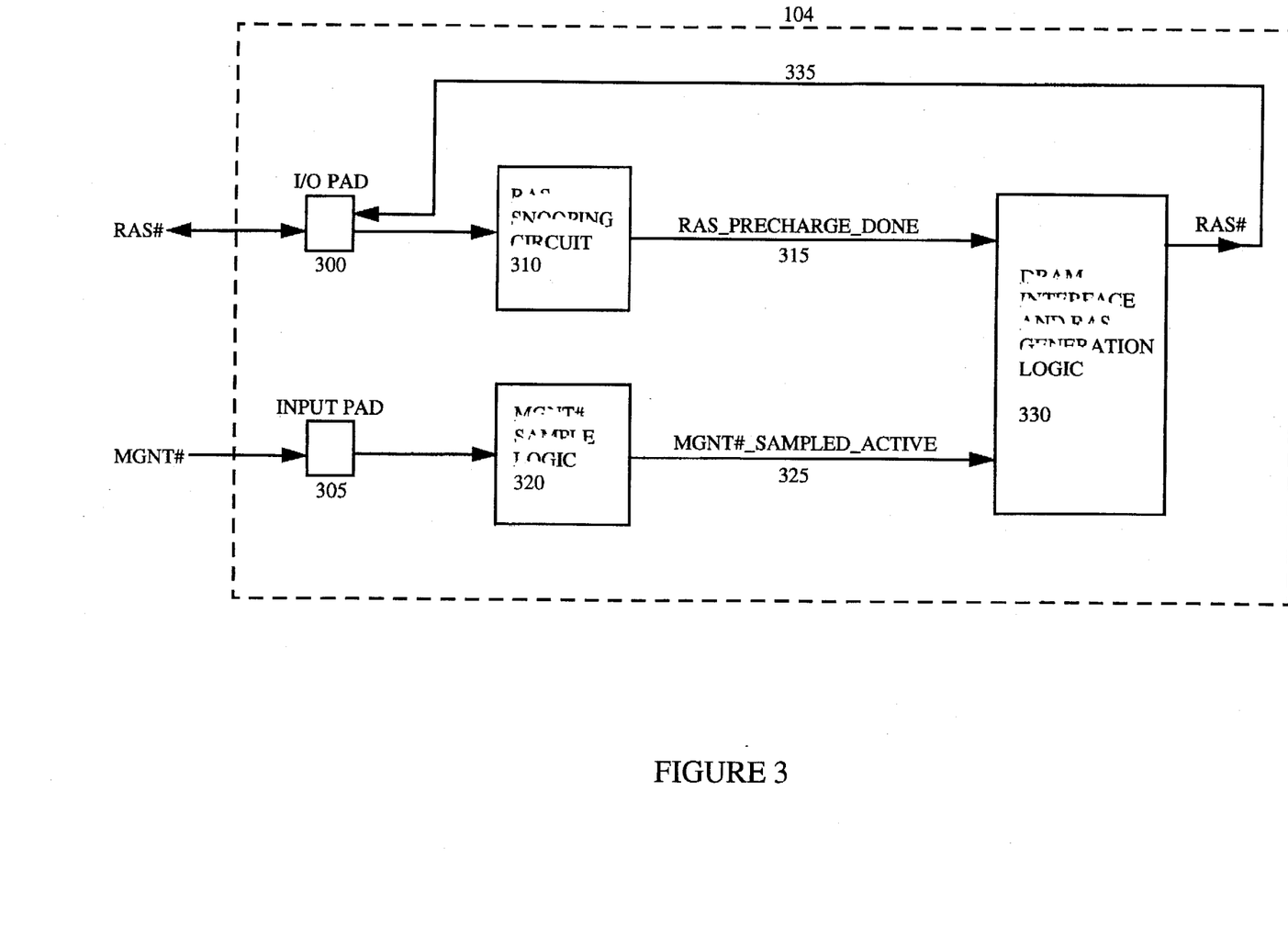
FIG. 3 is a block diagram illustrating a graphics controller including a row address strobe (RAS) signal snooping circuit, bi-directional input/output pad, RAS generation circuit, and memory grant sample logic circuit.

Reference is now made to FIG. 3, which is a block diagram illustrating internal architecture of one embodiment of graphics controller 104 of the preferred embodiment. Components of graphics controller 104 well known in the art are not shown in FIG. 3. Graphics controller 104 includes a bi-directional input/output (I/O) pad 300 for interfacing graphics controller 103 to memory bus 205 of FIG. 2.

Snooping circuit 310 including a detect logic circuit is coupled to I/O pad 300 for snooping the row address strobe (RAS) signals to graphics controller 103. Graphics controller 104 also includes memory grant sample logic 320 for receiving and sampling memory grant requests to graphics controller 104.

Graphic controller 104 further includes DRAM interface and RAS generation logic circuit 330 for generating pre-charged RAS signals from the graphics controller 104. The function of RAS generation circuit 330 and memory grant sample logic 320 is well known in the art and will not be described in detail.

Still referring to FIG. 3, I/O pad 300 receives a RAS# signal as an input to graphics controller 104. Input RAS# signal is driven by I/O pad 300 to RAS snooping circuit 310 to be monitored.

RAS snooping circuit 310 monitors the status of RAS# signal to drive a pre-charge-done signal to RAS generation circuit 330 when RAS pre-charge conditions are met in graphics controller 104.

In the preferred embodiment, the RAS# signal is monitored to detect RAS pre-charge by RAS snooping circuit 310. Snooping the RAS# signal enables graphics controller 104 to generate a pre-charged RAS# signal when MGNT# signal 204 is asserted by host controller 103, rather than waiting to pre-charge the RAS# signal after MGNT# signal 204 has been asserted. Pre-charging the RAS# signal also helps in reducing the memory access time by graphics controller 104 by at least one or more clocks.

MGNT# sample logic circuit 320 monitors MGNT# signal 204 from the host controller 103 to detect and determine whether MGNT# signal 204 is asserted or deasserted. When MGNT# signal 204 is sampled at active low at a memory clock edge indicating a memory grant request to graphics controller 104, output signal MGNT# sample active 325 from MGNT# sample logic circuit 320 is asserted to RAS generation circuit 330.

RAS generation circuit 330 drives output pre-charged RAS# signal 335 from graphics controller 104 via an output of I/O pad 300 to memory subsystem 105. Pre-charged RAS# signal 335 may be generated when MGNT# sample active 325 and RAS precharge done signal 315 are both asserted by graphics controller 104. RAS# signal 335 is driven only when graphics controller 104 has been given control of the frame buffer by host controller 103 through the output of I/O pad 300.

Figure 4:
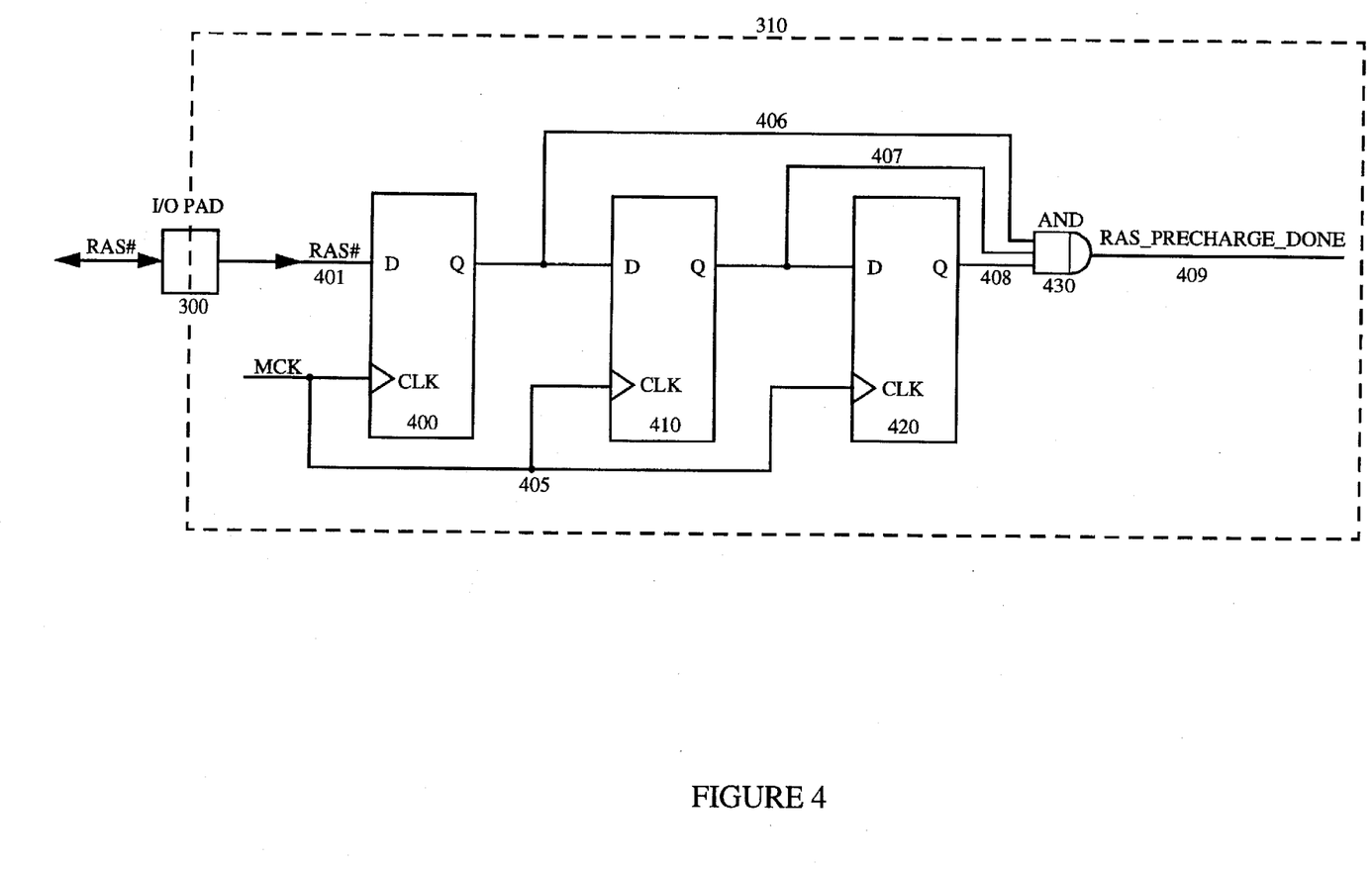
FIG. 4 is a waveform diagram illustrating the difference between snooping of the RAS signal lines and non snooping the RAS signal lines.

FIG. 4 is a block diagram illustrating one embodiment of RAS snooping circuit 310 of the preferred embodiment. RAS snooping circuit 310 may comprise a plurality of flip-flop clock circuitry 400, 410, and 420 for monitoring the RAS# signal driven by I/O pad 300 to graphics controller 104, and AND logic circuit 430 for driving the RAS pre-charge done signal 409 high to RAS generation circuit 330.

As illustrated in FIG. 4, I/O pad 300 drives low RAS# signal 401 to the D input of non-inverting flip-flop 400. The clocking input of non-inverting flip-flop 400 may be provided by memory clock signal (MCLK) 405, so at the next falling edge of MCLK 405, the non-inverting output of the flip-flop 400 goes low indicating the RAS# signal is inactive. The non-inverting output of flip-flop 400 may be selectively tied to the input of non-inverting flip-flop 410 and a first input of AND gate 430.

Flip-flop 410 receives RAS# signal 401 at its D input from flip-flop 400. The clock input of flip-flop 410 is also provided by the memory clock signal 405, so that at the next falling edge of MCLK 405, the non-inverting output of flip-flop 410 goes low indicating that RAS# signal 401 is still inactive. The non-inverted output of flip-flop 410 may be selectively supplied to the D input of flip-flop 420 and a second input of AND gate 430.

Non-inverting flip-flop 420 receives two clocked RAS# signal 401 at its D input. The clock input of flip-flop 430 is also provided by memory clock signal 405, so that at the next falling edge of MCLK, the inverting output of flip-flop 420 goes high indicating RAS# signal 401 is active. Flip-flop 420 drives active RAS# signal 401 out of its Q output to a third input of AND gate 430.

With all its inputs high, AND gate 430 drives a high RAS precharge done signal 409 to RAS generation circuit 330 to drive the pre-charge RAS signal in FIG. 3 to I/O pad 300. I/O pad 300 subsequently drives the pre-charge RAS# signal to shared memory subsystem 105.

As illustrated in FIG. 4, RAS snooping circuit 310 of the preferred embodiment pre-charges the RAS# signal for one or more clocks depending on load requirements in the computer system before driving the RAS# signal high. However, unlike the prior art, RAS pre-charging is performed when graphics controller 104 is in an inactive memory access state, rather than when graphics controller 104 is activated to access memory.

Figure 5:
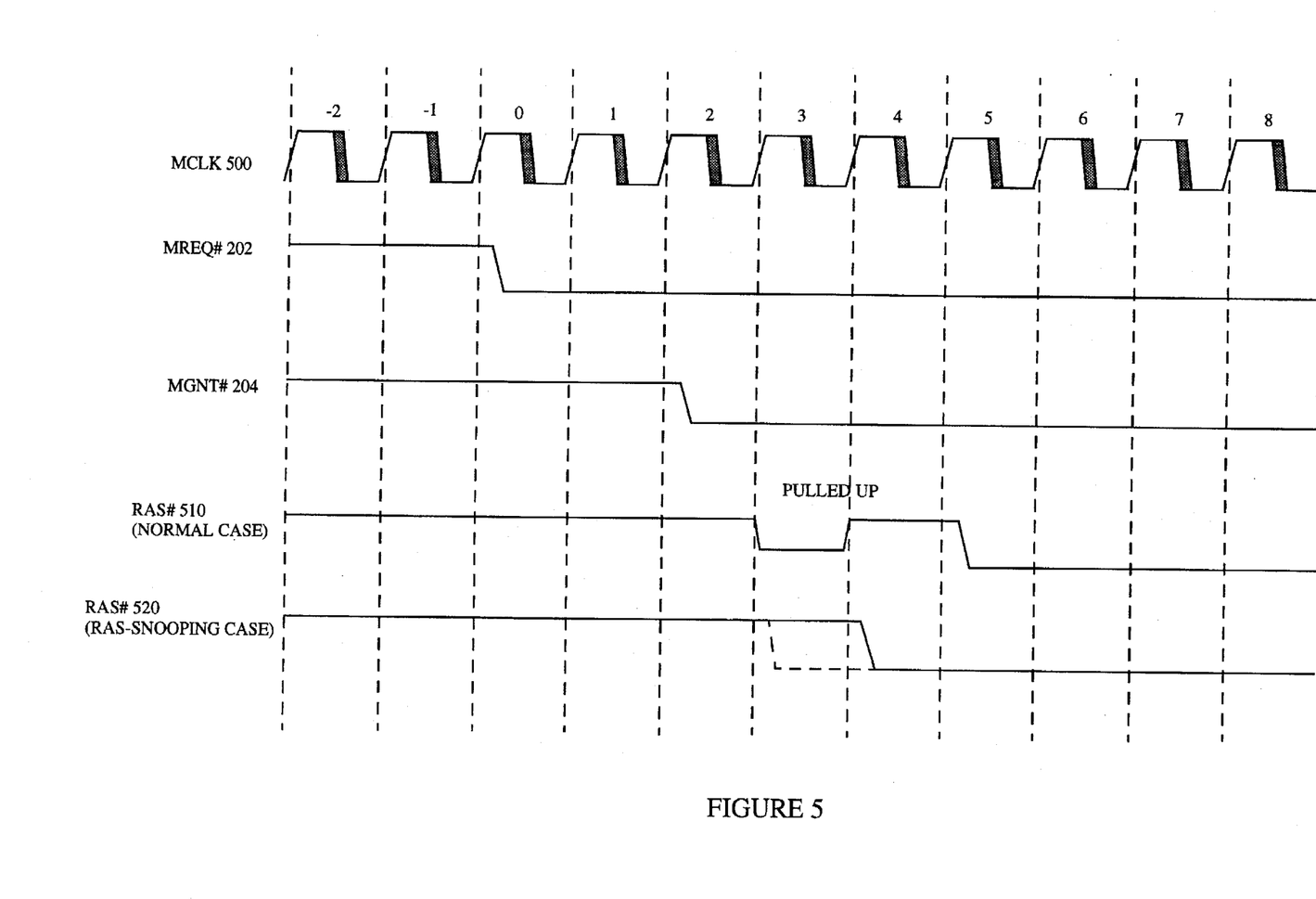
FIG. 5 is a block diagram of the detection circuit of the RAS snooping circuit of the preferred embodiment of the present invention.

FIG. 5, is a waveform diagram illustrating RAS pre-charging in the prior art and RAS pre-charging in one embodiment of the preferred embodiment. As illustrated in FIG. 5, graphics controller 103 activates memory request signal (MREQ#) at clock 0 to initiate a memory access to the frame buffer in shared memory subsystem 105.

If host controller 103 responds to a memory access request of graphics controller 104, memory grant signal (MGNT#) 204 may be asserted low in clock 2. In the prior art, the earliest time that the RAS# signal is asserted after the assertion of MGNT# signal 204 is in clock 5, since the RAS# signal may have to be pre-charged before being asserted as illustrated by RAS# signal 500.

In the preferred embodiment, RAS# signal 510 may be asserted in either clock 3 or 4 depending on the load in computer system 100, after MGNT# signal 204 has been asserted by host controller 103 thus granting graphics controller 104 access to the memory subsystem 105. By either asserting the RAS# signal in clock 3 or 4, the preferred embodiment reduces memory access time by graphics controller 104 by at least one or more clocks.

Figure 6:
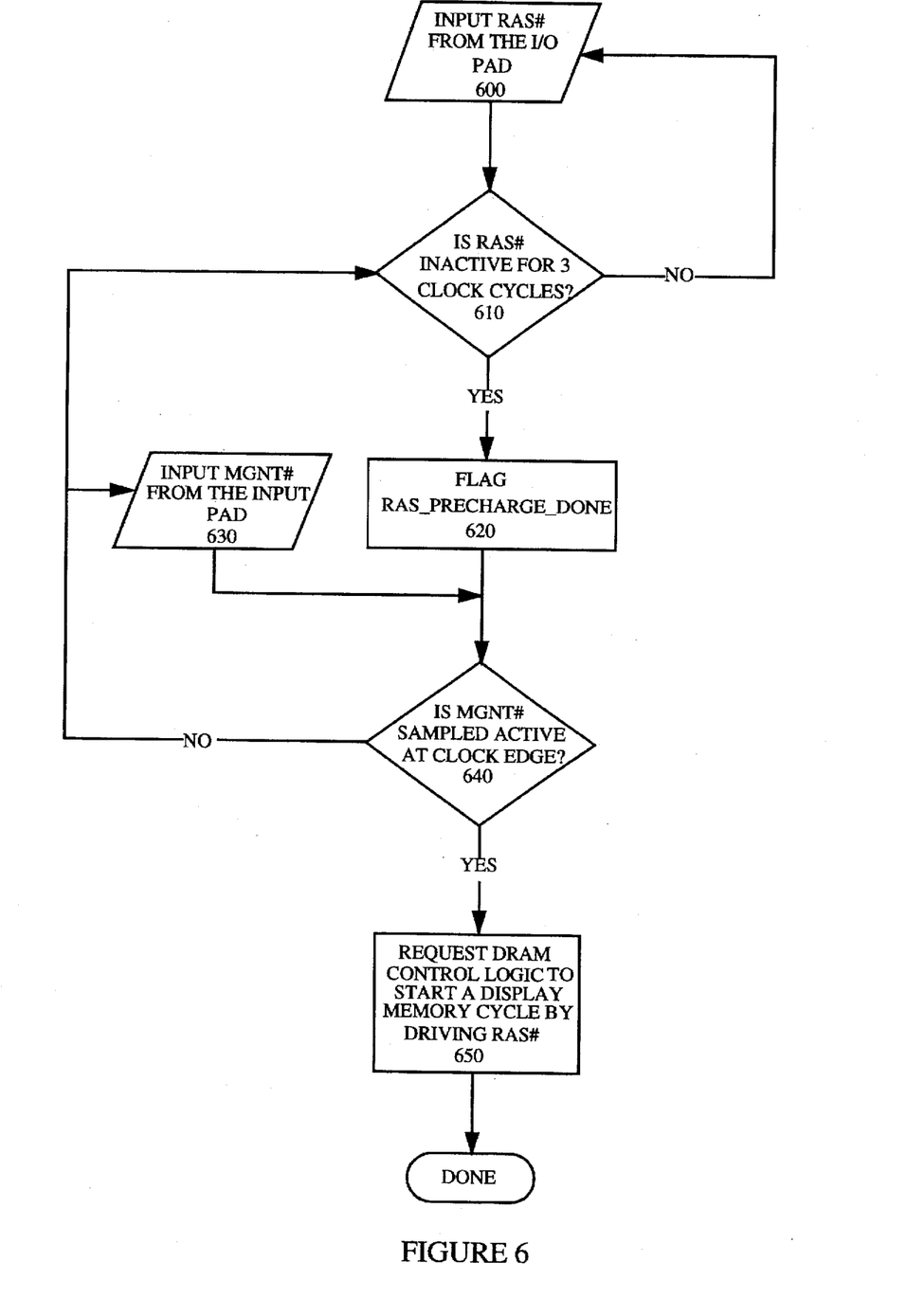
FIG. 6 is a flow chart illustrating a method of snooping the RAS lines and detecting when a RAS signal is pre-charged.

FIG. 6 is a flow diagram illustrating one embodiment of an implementation of the preferred embodiment. As illustrated in FIG. 6, the RAS snooping method of the preferred embodiment begins at processing box 600 when I/O pad 300 drives an input RAS# signal to snooping circuit 310. Processing continues at derision box 610 after I/O pad 300 has driven the input RAS signal to RAS snooping circuit 310.

At box 610, RAS snooping circuit 310 detects and determines whether the RAS# signal has been inactive for 3 clock cycles. If the RAS# signal has been inactive for three clock cycles, processing continues at box 620; otherwise processing continues at box 600.

At box 620, RAS snooping circuit 310 drives RAS precharge done signal 315 if the RAS# signal has been inactive for three clock cycles. And at box 630, memory grant signal MGNT# 204 is asserted to indicate that the graphics controller 104 has control of memory bus 205 to memory subsystem 105. Processing continues at decision box 640.

At box 640, memory grant signal MGNT# 204 may be detected by graphics controller 104 and sampled to determined if MGNT# signal 204 is active at the rising edge of a clock. If signal MGNT# 204 is sampled active, processing continues at box 650; otherwise processing continues at box 630.

At box 650 if the MGNT# signal 204 is sampled active by graphics controller 104 and RAS precharge done signal 315 is asserted high, RAS generation circuit 310 of graphics controller 104 drives a pre-charged RAS# signal to the memory subsystem to complete the RAS# signal snooping method of the present invention.

Thus, a method and apparatus for snooping the row address strobe signal in a graphics controller to reduce memory access time by the graphics controller is described. From the above description, it will be apparent that the invention disclosed herein provides a novel and advantageous method and apparatus for distinguishing between the types of dynamic random access memory in a computer system. The foregoing discussion discloses and describes exemplary methods and embodiments of the present invention. As will be understood by those familiar with the art, the invention may be embodied in other specific forms without departing from its spirit or essential characteristics, and thus, the described embodiment is not restrictive of the scope of the invention. The following claims are indicative of the scope of the invention. All variations which come within the meaning and range of equivalency of the claims are to be embraced within their scope.

What is claimed is:

1. A graphic controller comprising:
   a bi-directional input/output (I/O) pad having an input portion for receiving a RAS signal and an output portion for driving a pre-charged RAS signal to access a memory array;
   a row address strobe (RAS) signal monitor, coupled to said bi-directional I/O pad to receive said RAS signal and generate a pre-charge complete signal to indicate that said RAS signal is pre-charged after a predetermined pre-charge time;
   a memory grant logic for detecting an active memory grant signal to indicate to said bidirectional I/O pad to start generating said RAS signal, said memory grant logic operating in conjunction with said RAS signal monitor to detect said pre-charge complete signal in said RAS signal monitor; and
   a RAS generator coupled to said RAS signal monitor and said memory grant logic for generating said pre-charged RAS signal to said output portion of said I/O pad.

2. The graphic controller of claim 1, wherein said RAS signal monitor includes a signal detection logic to detect whether said RAS signal is logically inactive and to drive said pre-charge complete signal to said RAS generator to indicate that said second RAS signal is pre-charged.

3. The graphic controller of claim 1, wherein said predetermined pre-charge time is at least one or more memory clock cycles.

4. The graphic controller of claim 1, further comprising a power-on configuration setting means for programming the predetermined pre-charge time in said graphic controller.

5. The graphic controller of claim 1, wherein said RAS signal monitor further includes a pre-charging means to pre-charge said RAS signal after said predetermined period of pre-charge time.

6. The graphic controller of claim 1, wherein
   said memory grant signal and said pre-charge complete signal are respectively logically activated, and
   said RAS generator generates said pre-charged RAS signal to said output portion of said I/O pad.

7. A graphic controller having a row address strobe signal snooping means for monitoring a row address strobe (RAS) signal to determine whether said RAS signal is pre-charged to indicate an access to a memory array, said row address strobe signal snooping means comprising:
   a plurality of flip-flops coupled to receive an inactive RAS signal and outputting a first signal indicating said RAS signal is active, said plurality of flip-flops coupled to a clock signal for timing each of said plurality of flip-flops when said RAS signal is being pre-charged; and
   a RAS signal selector having a plurality of inputs coupled to respective outputs of each of said plurality of flip-flops, said RAS signal selector coupled to receive said inactive RAS signal and a single output of said plurality of flip-flops for logically generating a RAS pre-charge done signal after a pre-determined pre-charge time to indicate that said RAS signal is pre-charged.

8. The row address strobe signal snooping means of claim 7, wherein said plurality of flip-flops includes a first flip-flop for receiving said inactive RAS signal at a first clock period, said first flip-flop outputting said inactive RAS signal after said first clock period to said RAS signal selector.

9. The row address strobe signal snooping means of claim 8, wherein said plurality of further includes a second flip-flop coupled to said first flip-flop for receiving said inactive RAS signal after said first clock period for a second clock period, said second flip-flop selectively outputting said inactive RAS signal after said second clock period to said RAS signal selector.

10. The row address strobe signal snooping means of claim 9, wherein said plurality of flip-flops further includes a third flip-flop to said second flip-flop for receiving said inactive RAS signal at a third clock period, said third flip-flop outputting an inactive RAS signal at said third clock period to said RAS signal selector.

11. The row address strobe signal snooping means of claim 7, wherein said RAS signal selector is an AND gate.

12. The row address strobe signal snooping means of claim 7, wherein said pre-charge time is at least one or more memory clock cycles.

13. A computer system comprising:
   a bus for communicating information;
   a microprocessor coupled to said bus for processing instructions;
   a memory subsystem for storing information;
   a host controller coupled to said microprocessor for controlling access to said memory subsystem by said microprocessor; and a graphic controller coupled to said memory subsystem to receive and manipulate at least a portion of an incoming row address strobe (RAS) signal for controlling access to said memory subsystem by a graphic device, wherein said graphic controller further comprises:
    a RAS snooping means for monitoring said RAS signal in said graphic controller;
    a bi-directional input/output (I/O) pad having an input portion for receiving said RAS signal and an output portion for driving a pre-charged RAS signal to access said memory subsystem, said I/O pad coupled to said RAS snooping means;
    a memory grant logic for generating a second memory grant signal responsive to a first memory grant signal from said host controller to activate said graphic controller to begin access of said memory subsystem.

14. The computer system of claim 13, wherein said RAS snooping means includes a RAS signal detection means for detecting said RAS signal is inactive.

15. The computer system of claim 13, wherein said RAS snooping means further includes means for determining when said RAS signal has been inactive for a predetermined period of time.

16. The computer system of claim 12, wherein said graphic controller generates said pre-charged RAS signal responsive to said second memory grant signal being activated.

17. The computer system of claim 12, wherein said predetermined pre-charge time is at least one or more memory clock cycles.

18. The computer system of claim 14, wherein said RAS snooping means further includes a signal selection logic for selectively generating a RAS pre-charge done signal after the end of a predetermined pre-charge time to activate said RAS signal.

19. A method for monitoring and pre-charging a memory access signal in a graphic controller to reduce memory access in a computer system, said method comprising the steps of:
    receiving, in an input portion of a bi-directional input/output pad in the graphic controller, an inactive row address strobe (RAS) signal;
    monitoring said RAS signal in a RAS signal monitor coupled to the bi-directional I/O pad;
    receiving, in a memory grant logic in the graphic controller, a first memory request grant signal responsive to a memory access request by the graphic controller to access the memory;
    generating, in the memory grant logic, a second memory grant signal responsive to said first memory grant signal to activate the graphic controller to begin said memory access; and
    generating, in an output portion of the bi-directional input/output pad in the graphic controller, an active RAS signal to access the memory.

20. The method of claim 19, wherein said monitoring step includes the step of detecting inactivity of said RAS signal for a predetermined period of time.

21. The method of claim 19, wherein said monitoring step further includes the step of determining whether said RAS signal has been inactive for at least one or more memory clock cycles.

22. The method of claim 19, wherein said monitoring step further includes the step of generating a first signal to indicate that said RAS signal has been pre-charged.

23. The method of claim 19, wherein said active RAS signal is generated after said first signal is generated to said memory access.

24. The method of claim 19, wherein said active RAS signal is generated responsive to said second memory grant signal and said first signal being respectively generated in said graphic controller.

25. The method of claim 19, wherein said monitoring step includes the step of selecting said inactive RAS signal in response to load requirements in said computer system.

* * * * *